US007580530B2

(12) United States Patent
Konagai et al.

(10) Patent No.: US 7,580,530 B2
(45) Date of Patent: Aug. 25, 2009

(54) AUDIO CHARACTERISTIC CORRECTION SYSTEM

(75) Inventors: Yusuke Konagai, Hamamatsu (JP); Akira Usui, Hamamatsu (JP)

(73) Assignee: Yamaha Corporation (JP)

( * ) Notice: Subject to any disclaimer, the term of this patent is extended or adjusted under 35 U.S.C. 154(b) by 102 days.

(21) Appl. No.: 10/572,831

(22) PCT Filed: Sep. 24, 2004

(86) PCT No.: PCT/JP2004/014443

§ 371 (c)(1), (2), (4) Date: Mar. 22, 2006

(87) PCT Pub. No.: WO2005/032213

PCT Pub. Date: Apr. 7, 2005

(65) Prior Publication Data

US 2007/0036366 A1 Feb. 15, 2007

(30) Foreign Application Priority Data

Sep. 25, 2003 (JP) ............................ 2003-332980

(51) Int. Cl.
*H03G 3/00* (2006.01)

(52) U.S. Cl. ............................ 381/61; 381/63; 381/98

(58) Field of Classification Search ............ 381/61-63, 381/307, 310, 309, 89, 306, 300, 303, 26.56, 381/98

See application file for complete search history.

(56) References Cited

U.S. PATENT DOCUMENTS 5,109,416 A 4/1992 Croft
5,119,428 A * 6/1992 Prinssen ..................... 381/83
5,201,006 A 4/1993 Weinrich
5,233,664 A * 8/1993 Yanagawa et al. ............. 381/89
5,636,283 A * 6/1997 Hill et al. ...................... 381/17
5,809,153 A 9/1998 Aylward et al.
5,953,432 A 9/1999 Yanagawa et al.
6,111,962 A * 8/2000 Akio .......................... 381/63
6,141,415 A * 10/2000 Rao ..................... 379/406.08
6,791,519 B2 9/2004 Aarts et al.

(Continued)

FOREIGN PATENT DOCUMENTS

GB 0301093.1 * 1/2003

(Continued)

OTHER PUBLICATIONS

Relevant portion of International Search Report of corresponding PCT Application PCT/JP2004/014443.

(Continued)

*Primary Examiner*—Vivian Chin
*Assistant Examiner*—Disler Paul
(74) *Attorney, Agent, or Firm*—Rossi, Kimms & McDowell LLP

(57) ABSTRACT

An audio characteristic correction system adapted to an audio surround system in which a sound emitted from a directional speaker (an array speaker) is reflected on a wall surface or a sound reflection board so as to create a virtual speaker, at least one of frequency-gain characteristics, frequency-phase characteristics, and gain of an audio signal input to the directional speaker is corrected such that the sound reflected on the wall surface or the sound reflection board has desired audio characteristics at a desired listening position.

5 Claims, 10 Drawing Sheets

U.S. PATENT DOCUMENTS

| | | | | |
|---|---|---|---|---|
| 6,996,240 | B1 * | 2/2006 | Sasaki | 381/58 |
| 7,054,448 | B2 * | 5/2006 | Yoshino et al. | 381/59 |
| 7,092,541 | B1 | 8/2006 | Eberbach | |
| 7,362,874 | B2 | 4/2008 | Lee et al. | |

FOREIGN PATENT DOCUMENTS

| | | | |
|---|---|---|---|
| JP | 3-159500 | A | 7/1991 |
| JP | 6-178379 | A | 6/1994 |
| JP | 2000036993 | A | 2/2000 |

OTHER PUBLICATIONS

Related co-pending U.S. Appl. No. 10/572,832 ; Yusuke Konagai.; "Directional Speaker Control System"; Mar. 22, 2006 ; Spec. pp. 1-24 ; Figs. 1-16 ; Preliminary Amendment.

Relevant portion of International Search Report of PCT Application PCT/JP2004/014437 which corresponds with related co-pending U.S. Appl. No. 10/752,832.

* cited by examiner

AUDIO CHARACTERISTIC CORRECTION SYSTEM

This application is a U.S. National Phase Application of PCT International Application PCT/JP2004/014443 filed on Sep. 24, 2004.

TECHNICAL FIELD

This invention relates to audio characteristic correction systems and in particular to audio surround systems, in which sounds (or sound beams) emitted from directional speakers such as array speakers are reflected on wall surfaces of desired rooms or on sound reflection boards so as to create virtual sound sources, wherein audio characteristic correction systems correct audio characteristics of sounds reflected on sound reflection boards.

BACKGROUND ART

Recently, various types of audio sources have been distributed and provided in open markets; hence, 5.1-channel multichannel audio signals are recorded on DVDs (digital versatile disks), for example. Audio digital surround systems for reproducing audio sources have become common in households. FIG. 11 is a plan view showing an example of arrangement of speakers in an audio digital surround system, wherein reference symbol Zone designates a listening room for use in audio surround playback; reference symbol U designates a listening position; reference symbol SP-L designates a speaker for use in playback of a main left signal L; reference symbol SP-R designates a speaker for use in playback of a main right signal R; reference symbol SP-C designates a speaker for use in playback of a center signal C; reference symbol SP-SL designates a speaker for use in playback of a rear left signal SL; reference symbol SP-SR designates a speaker for use in playback of a rear right signal SR; reference symbol SP-SW designates a sub-woofer for use in playback of a sub-woofer signal (a low-frequency signal) LFE; and reference symbol MON designates a video device such as a television receiver.

The audio digital surround system of FIG. 11 can effectively realize various sound fields in the listening room Zone. However, this audio digital surround system, in which plural speakers are spread out and distributed in the listening room Zone, suffers from various drawbacks in that in order to arrange the rear speakers SP-SL and SP-SR for surround playback in the rear of the listening position U, wiring lengths therebetween must be increased, and in that the arrangement of the rear speakers SP-SL and SP-SR is limited due to the overall shape of the listening room Zone and due to the arrangement of furniture.

As a countermeasure solving the aforementioned drawbacks, there is provided an audio surround system in which rear speakers are each constituted using directional speakers each having sharp directivity and are arranged in front of the listening position, while a sound reflection board is arranged in the rear of the listening position. This is disclosed in Japanese Unexamined Patent Application Publication No. H06-178379, for example. Herein, surround-channel sounds emitted from directional speakers are reflected on the sound reflection board, thus demonstrating effects similar to those realized by arranging rear speakers in the rear of the listening position. FIG. 12 is a plan view showing an example of arrangement of speakers in the audio surround system disclosed in the aforementioned Japanese unexamined patent application publication, wherein reference symbols B-L and B-R designate sound reflection boards.

It is possible to use another method as shown in FIG. 13, in which a rear wall surface positioned in the rear of the listening position is used as a sound reflection board. For example, Japanese Unexamined Patent Application Publication No. H03-159500 discloses a three-dimensional stereo playback method in which array speakers are used to create virtual sound sources in a prescribed space. By use of this technology, it is possible to produce virtual speakers in the rear of the listening position.

As described above, it is possible to produce virtual speakers in the rear of the listening position by arranging sound reflection boards in the rear of the listening position or by using wall surfaces of a listening room as sound reflection boards. However, these methods may have difficulty in realizing virtual speakers having good audio characteristics because audio characteristics of the wall surfaces or sound reflection boards influence audio characteristics of the virtual speakers.

This invention is made to solve the aforementioned problems; and it is an object of the invention to provide an audio characteristic correction system adapted to an audio surround system in which sounds emitted from directional speakers are reflected on wall surfaces of a prescribed room or on sound reflection boards so as to produce virtual speakers, wherein audio characteristics of the wall surfaces or sound reflection boards are corrected for so as to improve audio characteristics of the virtual speakers.

DISCLOSURE OF THE INVENTION

This invention provides an audio characteristic correction system adapted to an audio surround system in which sounds emitted from directional speakers each having sharp directivity are reflected on wall surfaces of a prescribed room or on sound reflection boards so as to produce virtual speakers, wherein audio characteristics of the wall surfaces or sound reflection boards are corrected for. It has a characteristic correction means for correcting at least one of frequency-gain characteristics, frequency-phrase characteristics and gains of audio signals supplied to the aforementioned directional speakers in such a way that sounds reflected on the aforementioned wall surfaces or sound reflection boards have desired audio characteristics at a prescribed listening position. A sound emission device such as an array speaker or a parametric speaker realizing intense directivity is arranged at a prescribed position; sound waves output therefrom (i.e., sounds) are emitted to and reflected on a prescribed wall surface or a sound reflection board; thus, it is possible to realize sound localization in which a speaker may actually exist at a reflection position. Herein, the problem is audio characteristics of the wall surface or sound reflection board, which should be corrected for. This invention does not involve processing or modifying the wall or sound reflection board but correcting audio signals corresponding to sounds emitted from directional speakers, and thus imparting ideal audio characteristics (e.g., flat audio characteristics) to sounds reaching a listening position or imparting audio characteristics preferred by a listener.

In accordance with one embodiment, an audio characteristic correction system of this invention is constituted to include a measurement means for measuring audio characteristics of sounds reflected on the aforementioned wall surface or sound reflection board, and a control means for controlling at least one of frequency-gain characteristics, frequency-phase characteristics, and gains of the aforementioned characteristic correction means based on measurement results in such a way that sounds reflected on the wall surface or sound reflection board have desired audio characteristics at a listening position.

In accordance with this invention, which has a measurement means for measuring audio characteristics of sounds reflected on the wall surface or sound reflection board and a control means for controlling at least one of frequency-gain characteristics, frequency-phase characteristics, and gains of the characteristic correction means based on measurement results in such a way that sounds reflected on the wall surface or sound reflection board have desired audio characteristics at a listening position, it is possible to cope with differences of audio characteristics due to wall surfaces (or rooms). By measuring audio characteristics of sounds reflected on the wall surface or sound reflection board, it is possible to make a decision as to whether or not desired audio characteristics can be obtained; hence, it is possible to notify the listener of an even in which desired audio characteristics cannot be obtained in spite of the characteristic correction means performing correction.

BEST MODE FOR CARRYING OUT THE INVENTION

The preferred embodiments of this invention will be described in detail by way of examples with reference to the accompanying drawings.

FIRST EMBODIMENT

Figure 1:
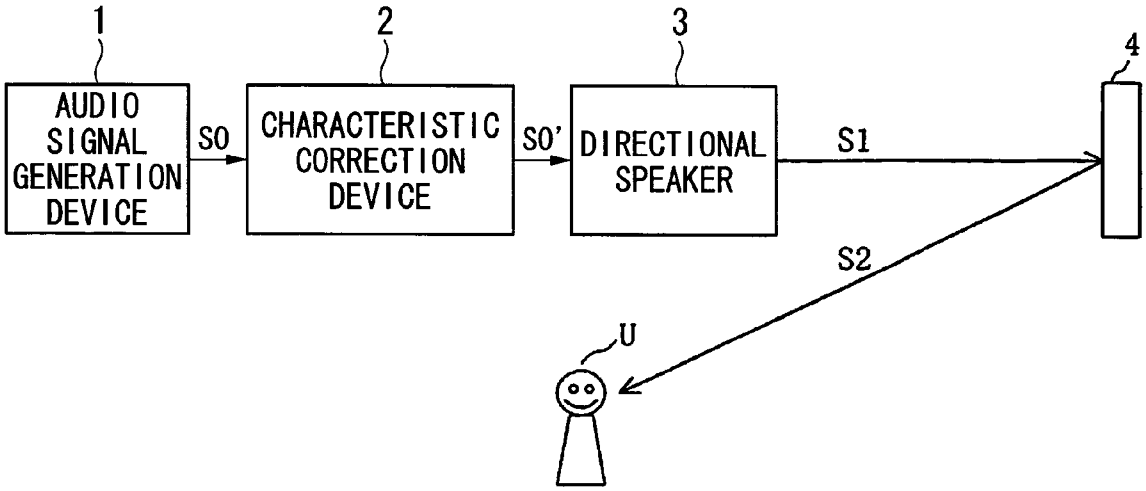
FIG. 1 is a block diagram showing the constitution regarding essential parts of an audio characteristics correction system in accordance with a first embodiment of this invention.

FIG. 1 is a block diagram showing the constitution of an audio characteristic correction system in accordance with a first embodiment of this invention. The audio characteristic correction system is applied to an audio surround system, wherein FIG. 1 shows only the constitution for a surround channel (i.e., a rear left signal SL or a rear right signal SR), and it does not show the constitution for a main channel (i.e., a main left signal L or a main right signal R).

The audio characteristic correction system in accordance with the first embodiment is constituted by an audio signal generation device 1 such as a DVD/CD player and an AV amplifier (audio-visual amplifier), a characteristic correction device 2 for correcting at least one of frequency-gain characteristics (or frequency-amplitude characteristics), frequency-phase characteristics (or group delay characteristics), and gains of audio signals output from the audio signal generation device such that sounds reflected on a wall surface of a listening room or a sound reflection board 4 have desired audio characteristics at a listening position U, and a directional speaker 3 for emitting sound towards the wall surface or the sound reflection board 4.

An audio signal S0 of a surround channel (i.e., a rear left signal SL or a rear right signal SR) output from the audio signal generation device 1 is subjected to correction in the characteristic correction device 2 so as to produce an audio signal S0'; based on the audio signal S0', the directional speaker 3 emits a sound S1, which is then reflected on the wall surface or the sound reflection board 4; hence, a reflected sound S2 reaches the listening position U. Thus, it is possible to realize sound localization as if a speaker actually existed at the wall surface or the sound reflection board 4. The characteristic correction device 2 imparts desired frequency-gain characteristics, desired frequency-phase characteristics, or desired gain to the audio signal S0 so as to output the audio signal S0'.

Figure 2:
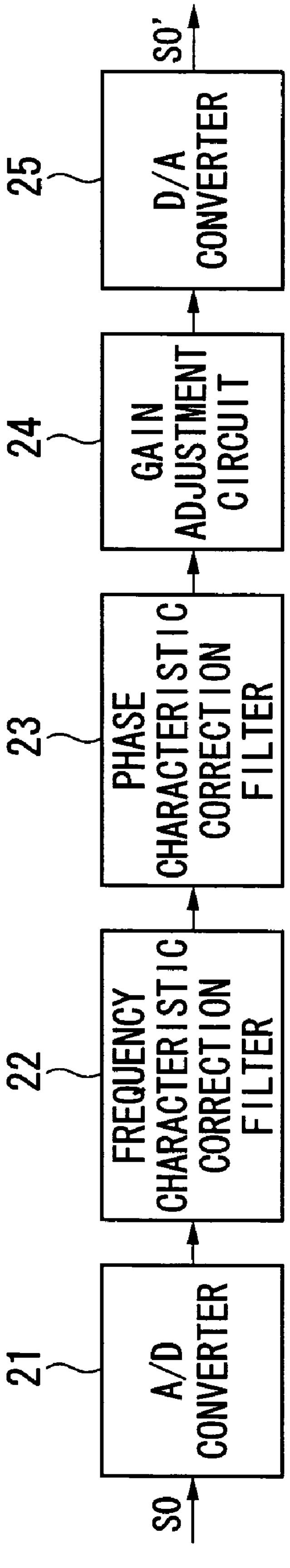
FIG. 2 is a block diagram showing the internal constitution of a characteristic correction device shown in FIG. 1.

FIG. 2 is a block diagram showing the constitution of the characteristic correction device 2. The characteristic correction device 2 is constituted by an A/D converter (an analog-to-digital converter) 21 for converting the audio signal S0 output from the audio signal generation device 1 into a digital signal, a frequency characteristic correction filter 22 for correcting an output signal of the A/D converter 21 to make the frequency-gain characteristic of the sound S2 reflected on the wall surface or the sound reflection board 4 have desired audio characteristics at the listening position U, a phase characteristic correction filter 23 for correcting an output signal of the frequency characteristic correction filter 22 to make the frequency-phase characteristic of the sound S2 have desired audio characteristics at the listening position U, a gain adjustment circuit 24 for adjusting a gain of an output signal of the phase characteristic correction filter 23 to make the sound S2 have a prescribed level at the listening position U, and a D/A converter (a digital-to-analog converter) 25 for converting an output signal of the gain adjustment circuit 24 into an analog signal.

It is preferable that the frequency characteristic correction filter 22, the phase characteristic correction filter 23, and the gain adjustment circuit 24 be constituted using digital circuits whose characteristics can be easily changed. That is, when digital filters are used for the frequency characteristic correction filter 22 and the phase characteristic correction filter 23, it is possible to realize any kinds of frequency-gain characteristics and frequency-phase characteristics because filter coefficients can be changed freely. In addition, when digital multipliers are used for the gain adjustment circuit 24, it is possible to freely adjust the gain by changing multiplication coefficients. Furthermore, when digital circuits are used for the frequency characteristic correction filter 22, the phase characteristic correction filter 23, and the gain adjustment circuit 24, it is possible to easily perform control by means of an external device.

Next, operations for correcting frequency-gain characteristics at the wall surface or the sound reflection board 4 will be described with reference to FIGS. 3A to 3G. The present embodiment is designed upon the presumption that ideal sound transmission characteristics are established in the space of a room for the purpose of avoiding complicacy in realization of a sound system model.

Figure 3A:
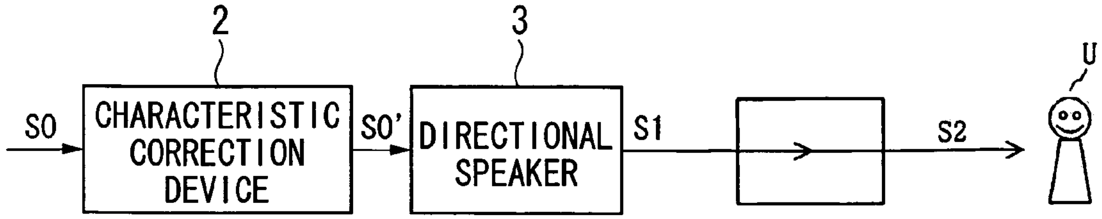
FIG. 3A is a simple block diagram showing an audio characteristic correction operation in accordance with the first embodiment.
Figure 3B:
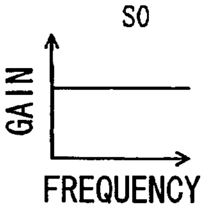
FIG. 3B shows flat frequency-gain characteristics realized by an audio signal S0.
Figure 3C:
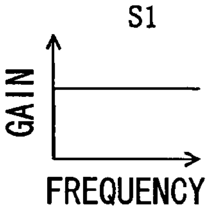
FIG. 3C shows frequency-gain characteristics of a sound S1 produced based on the audio signal S0 shown in FIG. 3A.

First, operation in which audio characteristic correction is not performed, i.e., the operation in which the characteristic correction device 2 is excluded from the constitution, will be described. When the audio signal generation device 1 outputs an audio signal S0, the directional speaker 3 emits a sound S1 towards the wall surface or the sound reflection board 4. When the audio signal S0 has a flat frequency-gain characteristic as shown in FIG. 3B and both the directional speaker 3 and the space have ideal sound transmission characteristics, the sound S1 has flat frequency-gain characteristics as shown in FIG. 3C and is emitted to the wall surface or the sound reflection board 4. The sound S1 reflects frequency-gain characteristics of the wall surface or the sound reflection board 4; hence, the reflected sound S2 reaching the listening position U has a frequency-gain characteristic shown in FIG. 3D.

Next, operation in which the characteristic correction device 2 is included in the constitution as described in the present embodiment will be described. The characteristic correction device 2 imparts characteristics reverse to the frequency-gain characteristics of the wall surface or the sound reflection board 4 to the audio signal S0 (having frequency-gain characteristics shown in FIG. 3E) output from the audio signal generation device 1. That is, the frequency characteristic correction filter 22 of the characteristic correction device 2 performs correction so as to increase gains with respect to prescribed frequencies damped at the wall surface or the sound reflection board 4.

Figure 3D:
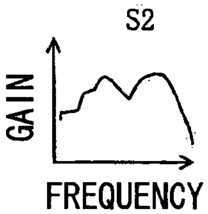
FIG. 3D shows frequency-gain characteristics of a sound S2 produced upon reflection of the sound S1 shown in FIG. 3C.
Figure 3E:
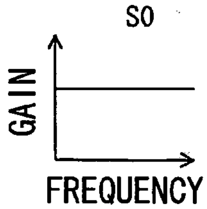
FIG. 3E shows flat frequency-gain characteristics realized by an audio signal S0.
Figure 3F:
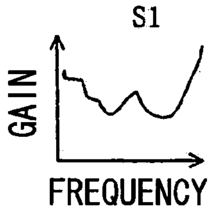
FIG. 3F shows frequency-gain characteristics of a sound S1 produced by correcting audio characteristics of the audio signal S0.
Figure 3G:
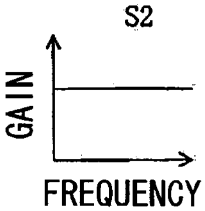
FIG. 3G shows frequency-gain characteristics of a sound S2 produced upon reflection of the sound S1 shown in FIG. 3F.

Due to the aforementioned correction, frequency-gain characteristics shown in FIG. 3F are imparted to the sound S1 that the directional speaker 3 emits towards the wall surface or the sound reflection board 4. When the sound S1 is reflected on the wall surface or the sound reflection board 4, it comes to have frequency-gain characteristics as shown in FIG. 3D. As a result, the frequency-gain characteristics shown in FIGS. 3D and 3F cancel each other out, so that the sound S2 reaching the listening position U comes to have flat frequency-gain characteristics as shown in FIG. 3G. As described above, the audio characteristics of the sound S1, which the directional speaker 3 emits towards the wall surface or the sound reflection board 4, are corrected in advance by means of the characteristic correction device 2; hence, it is possible to realize ideal frequency-gain characteristics at the listening position U.

The aforementioned description relates to correction of the frequency-gain characteristics; similarly, the frequency-phase characteristics can be corrected as well. That is, when a phase delay occurs with respect to a specific frequency upon the reflection on the wall surface or the sound reflection board 4, the corresponding frequency may be previously advanced in phase by means of the phase characteristic correction filter 23 in the characteristic correction device 2.

As for correction for absolute sound pressure damping characteristics, it is necessary to adjust the gain by means of the gain adjustment circuit 24 of the characteristic correction device 2 such that the sound S2 reflected on the wall surface or the sound reflection board 4 comes to have an optimal level (i.e., sound pressure) at the listening position U.

When virtual speakers are produced on the wall surface of a listening room, there are problems in that the virtual speakers may not realize audio characteristics (i.e., frequency-gain characteristics, frequency-phase characteristics, and gains) having constant quality, which is secured in actual speakers, and audio characteristics may differ in rooms due to materials of walls. When the sound reflection board is used as a virtual speaker, there is a probability of the price becoming higher in order to gain audio characteristics of constant quality or higher quality.

In the present embodiment, audio characteristics compensating for audio characteristics realized by the wall surface or the sound reflection board 4 are imparted to sounds emitted from the directional speaker 3 in advance; hence, it is possible to improve audio characteristics of sounds reflected on the wall surface or the sound reflection board 4; and this realizes more practical virtual speakers.

As described above, the characteristic correction device 2 can be realized using digital filters. Digital filters are not necessarily used for the purpose of corrections of audio characteristics, but they can simultaneously realize functions of parametric equalizers, for example; hence, they can be used to actively change frequency-phase characteristics of the system. By actively involving changes of characteristics of sound fields in rooms in characteristics realized by the characteristic correction device 2, it is possible to create sound fields suiting a user's preferences.

Incidentally, the present embodiment simultaneously corrects frequency-gain characteristics, frequency-phase characteristics, and absolute sound pressure damping characteristics at the wall surface or the sound reflection board 4. As this invention is not necessarily limited to the present embodiment, it is possible to correct at least one of the aforementioned characteristics. In the constitution shown in FIG. 2, the A/D converter 21 is incorporated into the characteristic correction device 2. However, when the audio signal generation device 1 is designed to output digital signals, the A/D converter 21 is not needed.

SECOND EMBODIMENT

Next, a second embodiment of this invention will be described. The second embodiment uses an array speaker as the directional speaker 3 shown in the first embodiment.

Figure 4:
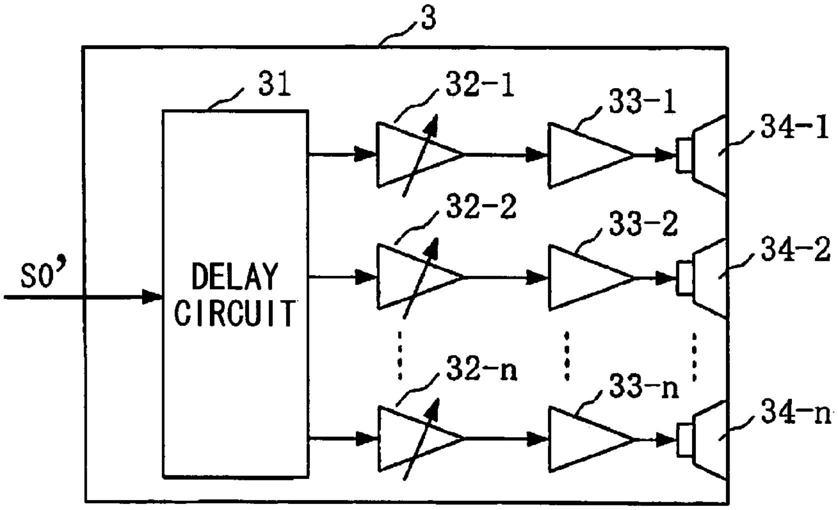
FIG. 4 is a block diagram showing the internal constitution of a directional speaker applied to an audio characteristic correction system in accordance with a second embodiment of this invention, wherein an array speaker is used.

FIG. 4 is a block diagram showing an example of the constitution of the directional speaker 3 using an array speaker. The directional speaker 3 in the second embodiment includes a delay circuit 31 for applying a delay time, corresponding to directivities (focal positions of sounds) to be realized, to an audio signal S0' output from the characteristic correction device 2, plural gain adjustment circuits 32 (32-1 to 32-n) for adjusting gains of output signals of the delay circuit 31 to prescribed levels, plural amplifiers 33 (33-1 to 33-n) for amplifying output signals of the gain adjustment circuits 32, and plural speakers 34 (34-1 to 34-n) driven by the amplifiers 33.

Figure 5:
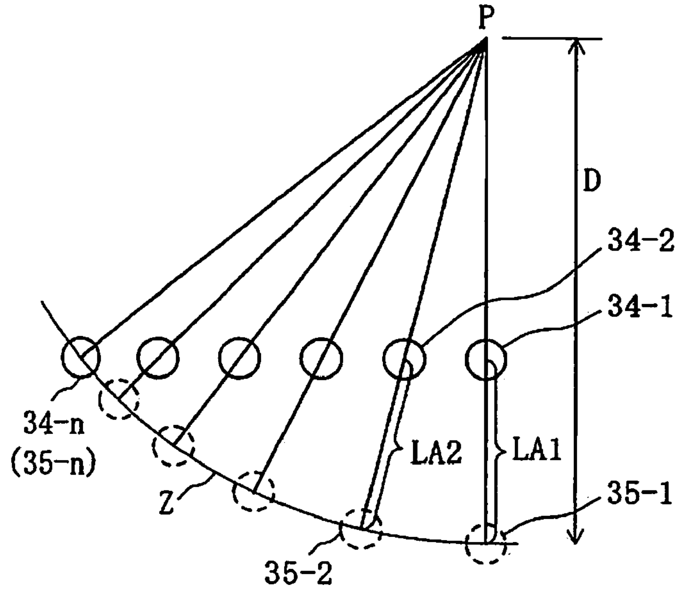
FIG. 5 is a drawing for explaining directivity control for virtual speakers, which are realized by an array speaker.

The directional speaker 3 controls directivities of sounds emitted from the speakers 34 such that the sounds are directed towards a prescribed wall surface or a sound reflection board 4. Next, directivity control of the directional speaker 3 will be described with reference to FIG. 5. Suppose that a circular arc Z is drawn with a distance D from a position P of a wall surface or a sound reflection board 4, and line segments connecting the position P and the plural speakers 34 (34-1 to 34-n) included in the directional speaker 3 are extended to intersect with the circular arc Z at intersection points designated by dotted circles, so that virtual speakers 35 (35-1 to 35-n) are arranged at the positions of the dotted circles. The same distance D lies between the position P and the virtual speakers 35; hence, sounds emitted from the virtual speakers 35 may reach the position P at the same time.

In order to make sure that all the sounds emitted from the speakers 34-i (where i=1, 2, . . . , n) included in the directional speaker 3 reach the position P at the same time, it is necessary to apply delay times LAi/V (where V represents sound transmission velocity), corresponding to distances LAi between the speakers 34-i and the corresponding virtual speakers 35-i, to an input signal. Based on this operation principle of an array speaker, the delay circuit 31 in the directional speaker 3 applies delay times LAi/V, corresponding to the speakers 34-i, to the audio signal S0' input thereto, thus producing n delayed audio signals.

The gain adjustment circuits 32-i adjust gains of output signals of the delay circuit 31; then, the amplifiers 33-i amplify output signals of the gain adjustment circuits 32-i so as to drive the speakers 34-i. As described above, by adjusting delay times applied to audio signals with respect to the speakers 34-i, it is possible to control directivities of sounds emitted from the directional speaker 3; hence, it is possible to adjust phases of sounds at a single point (i.e., a focal point) in space emitted from the speakers 34-i.

As described above, by use of an array speaker, it is possible to realize sound localization with respect to the position of a focal point, corresponding to a single point arbitrarily set in space, at which a speaker may exist. This makes it possible to arrange virtual speakers on the wall surface or the sound reflection board 4 as well as to create a focal point on which sounds reflected on the wall surface or the sound reflection board 4 may focus. Thus, it is possible to arrange virtual speakers at desired positions in space defined between the wall surface or the sound reflection board 4 and the listening position U.

Figure 6:
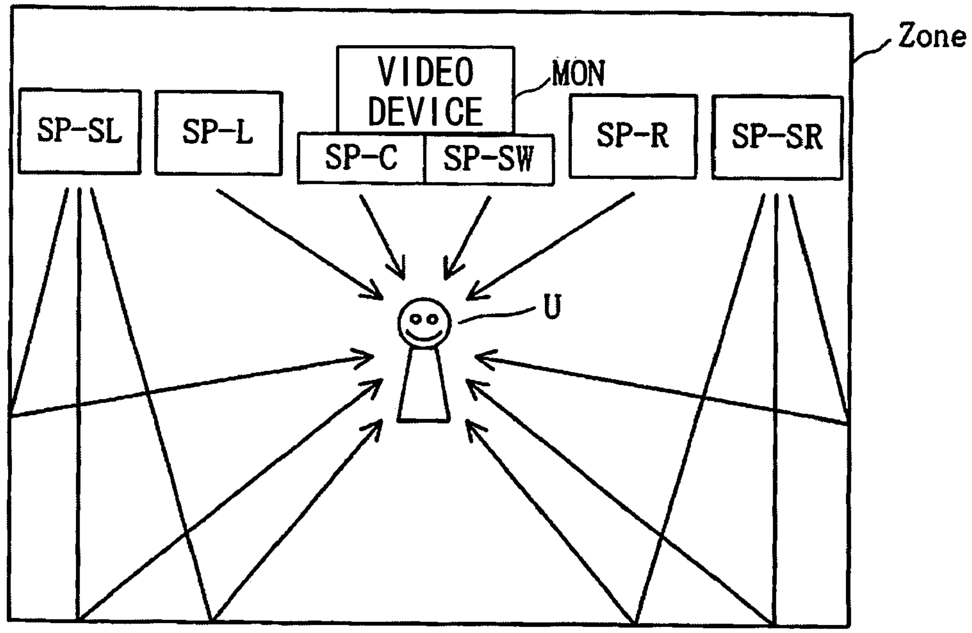
FIG. 6 shows an example in which numerous virtual speakers are realized by use of array speakers.
Figure 7:
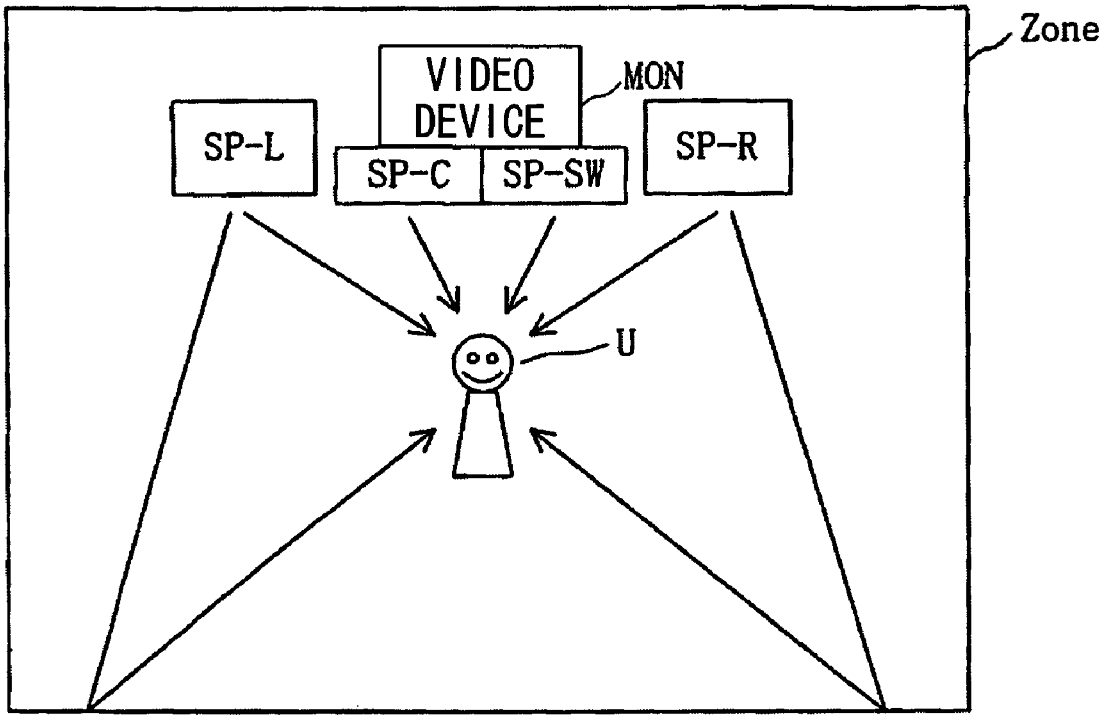
FIG. 7 shows an example in which array speakers simultaneously output audio signals of main channels and surround channels.

By use of plural speakers included in an array speaker, it is possible to simultaneously produce plural sounds having different directivities. In this case, as shown in FIG. 6, it is possible to realize numerous virtual speakers. In addition, as shown in FIG. 7, it is possible to simultaneously output audio signals of main channels and audio signals of surround channels. In the case of FIG. 6, each of the speakers SP-SL and SP-SR corresponds to the directional speaker 3; hence, each of the speakers SP-SL and SP-SR simultaneously emits plural sounds having different directivities. In the case of FIG. 7, each of the speakers SP-L and SP-R corresponds to the directional speaker 3; hence, each of the speakers SP-L and SP-R simultaneously emits an audio signal of a main channel and an audio signal of a surround channel.

Incidentally, when the delay circuit 31 for an array speaker is constituted using a digital circuit, it is unnecessary to use the D/A converter 25 in the characteristic correction device 2.

THIRD EMBODIMENT

Figure 8:
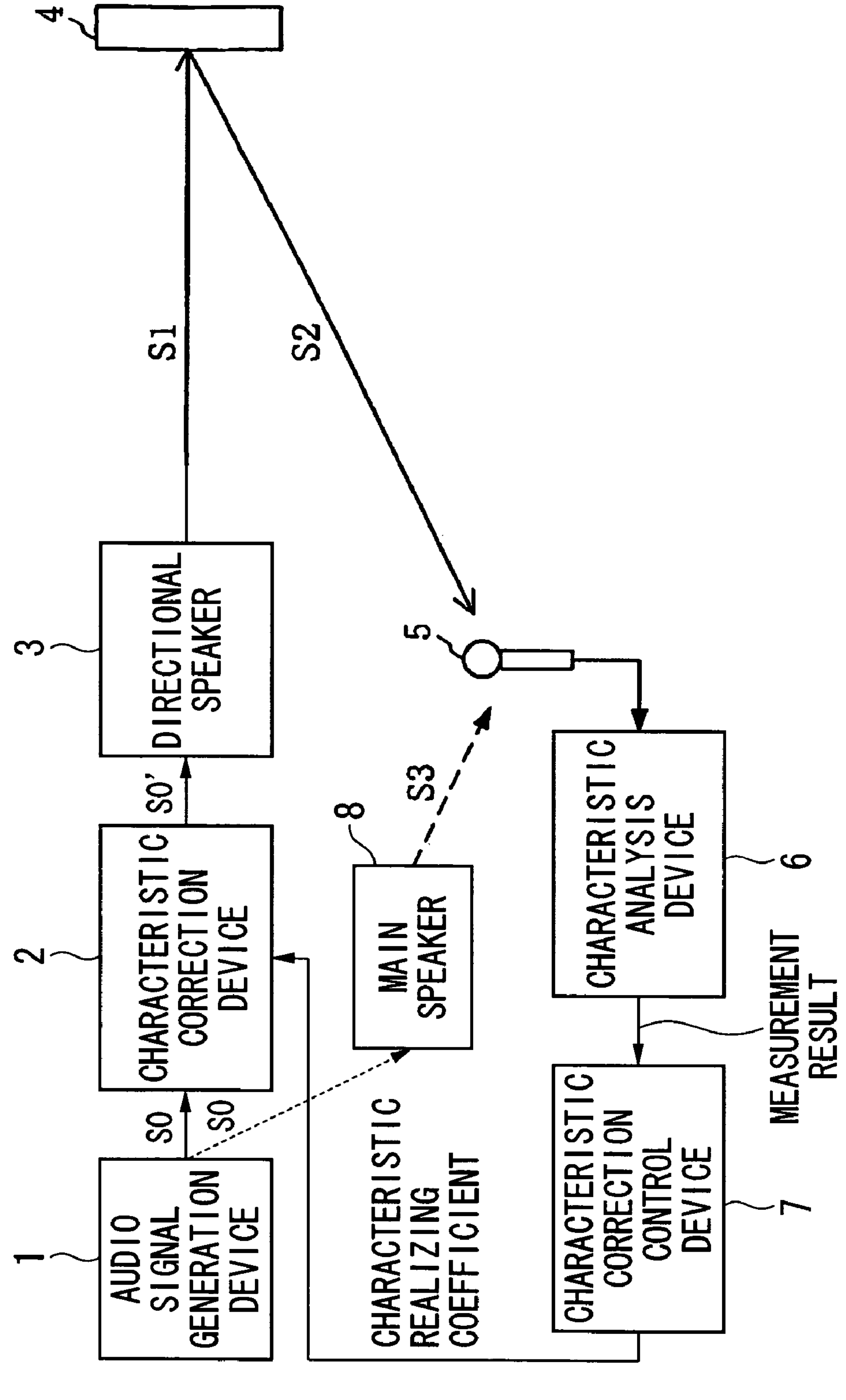
FIG. 8 is a block diagram showing the constitution of an audio characteristic correction system in accordance with a third embodiment of this invention.

Next, a third embodiment of this invention will be described. FIG. 8 is a block diagram showing an audio characteristic correction system in accordance with the third embodiment, wherein parts identical to those of the first embodiment shown in FIG. 1 are designated by the same reference numerals. The audio characteristic correction system of the third embodiment includes an audio signal generation device 1, a characteristic correction device 2, a directional speaker 3, a microphone 5, a characteristic analysis device 6 for analyzing audio characteristics of sounds picked up by the microphone 5, a characteristic correction control device 7 for controlling at least one of frequency-gain characteristics, frequency-phase characteristics, and gain of the characteristic correction device 2 based on the analysis results of the characteristic analysis device 6 such that a sound S2 reflected on the wall surface or the sound reflection board 4 has desired audio characteristics at a listening position, and a main speaker 8 for outputting an audio signal of a main channel (i.e., a main left signal L or a main right signal R). The aforementioned microphone 5 and characteristic analysis device 6 form a measurement means, and the characteristic correction control device 7 forms a control means.

The audio signal generation device 1 generates an audio signal S0 for measurement, such as an impulse signal suitable for audio characteristic analysis, band noise having a specific frequency band, and a sweep signal. A sound S1 emitted from the directional speaker 3 is reflected on the wall surface or the sound refection board 4 and is thus converted into a sound S2, which is picked up by the microphone 5 arranged at the listening position. The characteristic analysis device 6 analyzes audio characteristics of the sound S2 so as to produce transmission characteristics of the system, i.e., audio characteristics of the wall surface or the sound reflection board 4. The characteristic correction control device 7 calculates characteristics which should be imparted to the audio signal S0 in order to correct audio characteristics of the wall surface or the sound reflection board 4, thus controlling the characteristic correction device 2.

Next, operation for measuring the frequency-gain characteristics and frequency-phase characteristics of the sound S2 reflected on the wall surface or the sound reflection board 4 and operation for controlling the frequency-gain characteristics and frequency-phase characteristics of the characteristic correction device 2 based on measurement results will be described. Herein, the audio signal generation device 1 generates band noise having a certain frequency band as the audio signal S0 for measurement. In this case, the characteristic correction device 2 is put into a through state (where S0=S0'), and the main speaker 8 is put into an OFF state (i.e., a silent state). The band noise output from the audio signal generation device 1 is emitted as the sound S1 towards the wall surface or the sound reflection board 4 by means of the directional speaker 3, whereby it is reflected and then reaches the microphone 5 arranged at the listening position as the sound S2.

The characteristic analysis device 6 measures the level (i.e., sound pressure) of the sound S2 that is picked up by the microphone 5. Such measurement operation is repeatedly performed after changing the frequency of the band noise output from the audio signal generation device 1. Thus, it is possible to measure the frequency-gain characteristics of the sound S2. The characteristic analysis device 6 sends the results of measurement of the frequency-gain characteristics of the sound S2 to the characteristic correction control device 7.

Based on the frequency-gain characteristics of the sound S2 measured by the characteristic analysis device 6, the characteristic correction control device 7 calculates filter characteristics of the frequency characteristic correction filter 22 in the characteristic correction device 2 so as to calculate filter coefficients realizing filter characteristics and to set them for the frequency characteristic correction filter 22 such that the sound has desired frequency-gain characteristics at the listening position.

When the audio signal generation device 1 generates a sweep signal whose frequency continuously varies or an impulse signal as the audio signal S0 for measurement, the sound S2 picked up by the microphone 5 is subjected to digital signal processing in the characteristic analysis device 6, making it possible to measure the frequency-gain characteristics of the sound S2 efficiently and with a high precision, and to measure the frequency-phase characteristics of the sound S2 as well.

The characteristic correction control device 7 operates based on the frequency-phase characteristics of the sound S2, which are measured and analyzed by the characteristic analysis device 6, so that it calculates filter characteristics of the phase characteristic correction filter 23 in the characteristic correction device 2 so as to calculate filter coefficients realizing filter characteristics and to set them for the phase characteristic correction filter 23 such that a desired frequency-phase characteristics are realized at the listening position.

Next, operation for measuring the absolute sound pressure damping characteristics of the sound S2 reflected on the wall surface or the sound reflection board 4 and operation for controlling the gain of the characteristic correction device 2 based on the measurement results will be described. The audio signal generation device 1 generates an audio signal S0 having a constant level for measurement. In this case, the characteristic correction device 2 is put into a through state, and the main speaker 8 is put into an OFF state (i.e., a silent state). The directional speaker 3 emits a sound S1 based on the audio signal S0 for measurement, which is output from the audio signal generation device 1, so that the sound S1 is reflected on the wall surface or the sound reflection board 4 and is converted into a sound S2, which reaches the microphone 5 at the listening position. The characteristic analysis device 6 measures the level (i.e., sound pressure) of the sound S2 picked up by the microphone 5.

Since the directional speaker 3 is put into an OFF state (i.e., a silent state), the audio signal S0 having the constant level for measurement is supplied to the main speaker 8. The main speaker 8 produces a sound S3 based on the audio signal S0 for measurement and emits it towards the microphone 5 at the listening position. The characteristic analysis device 6 measures the level (i.e., sound pressure) of the sound S3 picked up by the microphone 5. With reference to the level of the sound S3, the characteristic correction control device 7 calculates the gain of the characteristic correction device 2 so as to calculate a gain coefficient realizing the gain and to set it for the gain adjustment circuit 24 in the characteristic correction device 2 such that the level of the sound S2 comes to have an optimal value.

After the setup of the characteristic correction device 2, the audio signal generation device 1 generates an audio signal of a main channel, which is then supplied to the main speaker 8, and an audio signal of a surround channel, which is then supplied to the characteristic correction device 2.

When virtual speakers are realized on wall surfaces of a listening room, audio characteristics differ due to materials of the walls in the room. According to the present embodiment, audio characteristics of the wall surface or the sound reflection board 4 are measured in advance; hence, it is possible to cope with differences of audio characteristics.

Due to the aforementioned measurement, sounds of speakers directly reaching the microphone 5, sounds indirectly reaching the microphone 5 by way of the wall surface or the sound reflection board 4 acting as virtual speakers, and sounds that reach the microphone 5 after being reflected on the other wall surface are inevitably intermixed together; hence, even when sophisticated digital signal processing technology is used, it is difficult to extract only the necessary sounds. As one method for simplifying measurement in such environments, it is possible to use a method in which a directional microphone is used as the microphone 5 so as to selectively pick up the sound subjected to measurement.

In the present embodiment, desired characteristics can be set for the characteristic correction device 2 based on measurement results. Instead, an audio signal S for measurement, which is output from the audio signal generation device 1, may be supplied to the characteristic correction device 2 so as to emit a sound S1, which is subjected to reflection so as to produce a sound S2, which is then subjected to re-measurement with respect to frequency-gain characteristics, frequency-phase characteristics, and absolute sound pressure damping characteristics, thus setting characteristics again for the characteristic correction device 2 based on the re-measurement results. Thus, it is possible to improve correction precision.

The present embodiment uses the sound S3, which the main speaker 8 emits directly to the microphone 5, as the basis of measurement with regard to the absolute sound pressure damping characteristics. Instead, the directional speaker 3 may be changed in directivity, so that the sound which the directional speaker 3 emits directly to the microphone 5 can be used as the basis of measurement. As described above, it is possible to easily change the directivity by use of an array speaker in the present embodiment.

When a single directional speaker 3 (designated by SP-SL or SP-SR) is used to realize plural virtual speakers as shown in FIG. 6, it may be necessary to provide a characteristic correction device 2 for correcting an audio signal per each virtual speaker. Instead, when plural virtual speakers are arranged on the same wall surface, the aforementioned measurement may be performed on a single point on the wall surface, so that the frequency-gain characteristics, frequency-phase characteristics, and gain, which are produced based on measurement results, are set for the characteristic correction device 2. This simplifies the measurement adjustment processes.

FOURTH EMBODIMENT

In the aforementioned third embodiment, audio characteristics regarding the reflection on the wall surface or the sound reflection board are measured, so that the characteristic correction control device 7 calculates the frequency-gain characteristics, frequency-phase characteristics, and gain for the characteristic correction device 2 based on the measurement results. Instead, plural types of correction patterns, corresponding to combinations of frequency-gain characteristics, frequency-phase characteristics, and gains for the characteristic correction device 2, may be set in advance for the characteristic correction control device 7, so that the characteristic correction control device 7 selects an appropriate correction pattern based on the measurement results. This simplifies the calculation processes in the characteristic correction control device 7.

In addition, it is possible to modify the embodiment so that a listener sets an appropriate correction pattern for the characteristic correction device 2 based on a listening result at a listening position. In this case, the measurement processes can be substantially simplified; hence, it is unnecessary to use the microphone 5 and the characteristic analysis device 6.

FIFTH EMBODIMENT

Figure 9:
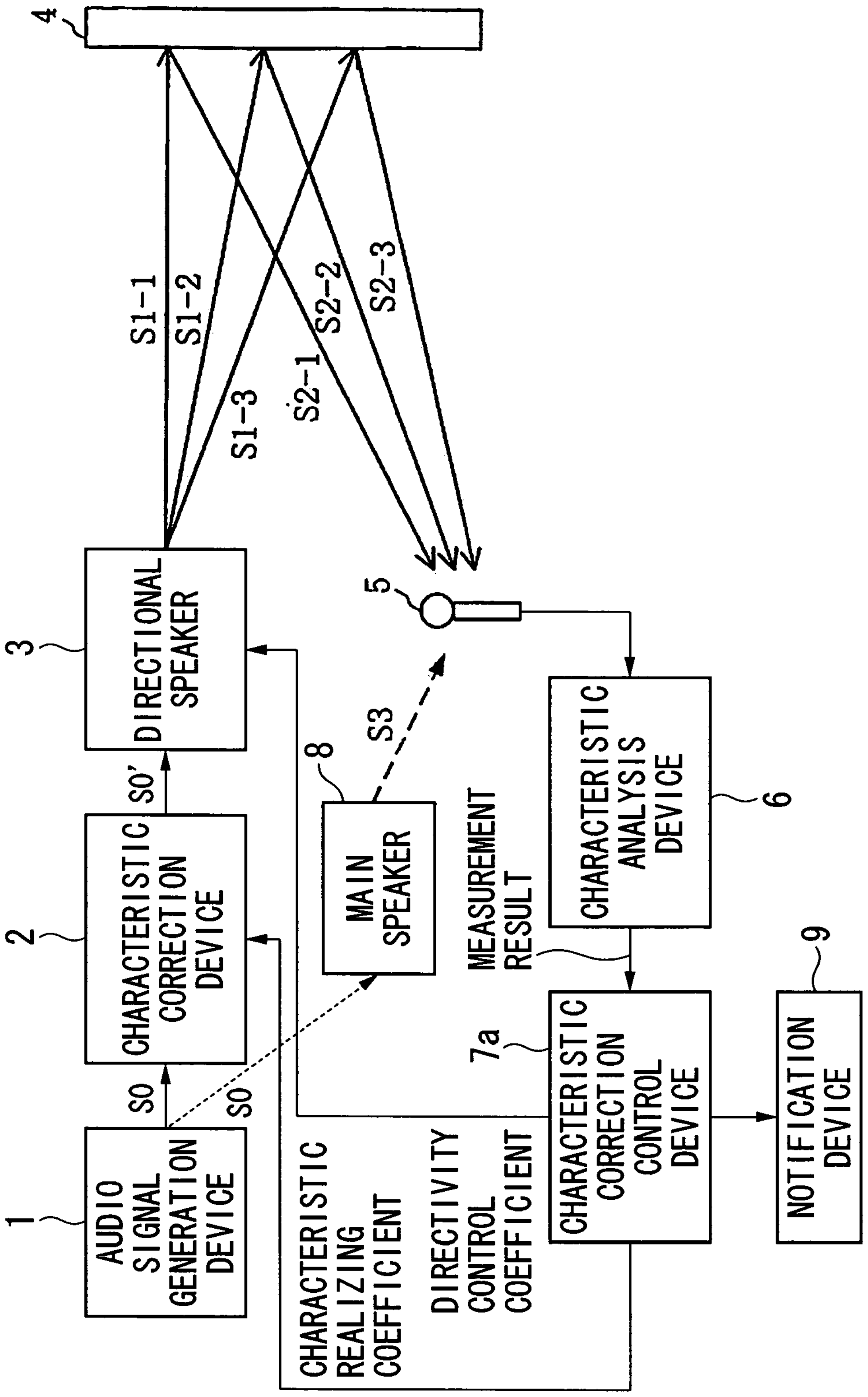
FIG. 9 is a block diagram showing the constitution of an audio characteristic correction system in accordance with a fifth embodiment of this invention.

Next, a fifth embodiment of this invention will be described. FIG. 9 is a block diagram showing the constitution of an audio characteristic correction system in accordance with the fifth embodiment, wherein parts identical to those of the third embodiment shown in FIG. 8 are designated by the same reference numerals. By executing the aforementioned measurement described in conjunction with the third embodiment, it is possible to measure audio characteristics with regard to the wall surface or the sound reflection board 4. However, when using such measurement functions, in the case of a sound absorption wall having a very high damping ratio and in the case where relatively large peaks and bottoms exist in frequency-gain characteristics, for example, even when the characteristic correction device 2 performs correction based on measurement results of audio characteristics, desired audio characteristics may not always be realized at the listening position. The fifth embodiment is characterized in that when a desired correction effect cannot be expected of the characteristic correction device 2, the directivity of the directional speaker 3 is automatically changed, so that virtual speakers having good audio characteristics can be arranged on the wall surface or the sound reflection board 4.

Hereinafter, the operation of the present embodiment will be described with reference to FIG. 9. Herein, the fifth embodiment is identical to the third embodiment in terms of the constitution and operation for measuring the frequency-gain characteristics, frequency-phase characteristics, and absolute sound pressure damping characteristics with respect to the sound S2 reflected on the wall surface or the sound reflection board 4.

In FIG. 9, the characteristic correction control device 7*a* has functions for controlling the directivity of the directional speaker 3 in addition to functions of the characteristic correction control device 7 used in the third embodiment, and after completion of measurement, it sends prescribed directivity control coefficients to the delay circuit 31 in the directional speaker 3. The delay circuit 31 changes delay times applied to audio signals supplied to speakers 34 in response to the directivity control coefficients, thus changing the focal position of the sound S1 emitted from the directional speaker 3.

As described above, the present embodiment repeatedly performs measurement on the sound S2 reflected on the wall surface or the sound reflection board 4 while changing the directivity of the directional speaker 3. In FIG. 9, the directional speaker 3 emits three sounds S1-1, S1-2, and S1-3, each of which is produced by slightly changing the directivity; hence, these sounds are reflected on the wall surface or the sound reflection board 4 so as to produce three sounds S2-1, S2-2, and S2-3, characteristics of which are measured. The characteristic correction control device 7*a* stores measurement results regarding characteristics of the sounds S2-1, S2-2, and S2-3 in relation to directivity control coefficients, which are used in the measurement.

Thereafter, the characteristic correction control device 7*a* selects optimum characteristics from among characteristics of the stored sounds S2 so as to select the corresponding directivity control coefficients, which in turn correspond to positions (i.e., focal positions) on the wall surface or the sound reflection board 4 and are set up as representations of positions of virtual speakers.

As described above, the present embodiment executes measurement while automatically changing the directivity of the directional speaker 3; hence, it is possible to prevent virtual speakers from being realized on a wall surface or the sound reflection board having poor audio characteristics. This makes it possible for virtual speakers to be realized on a wall surface or the sound reflection board having good audio characteristics.

Through the repeatedly performed measurement of the sound S2 reflected on the wall surface or the sound reflection board 4 while changing the directivity of the directional speaker 3, when it is judged that the characteristic correction device 2 has a low correction effect, the characteristic correction control device 7*a* notifies a listener via a notification device 9 that desired audio characteristics cannot be obtained. As a notification method for a listener, it is possible to turn on a prescribed lamp or to display a message that desired audio characteristics cannot be obtained on a display screen, for example. Upon receipt of such notification, the listener may prepare another sound reflection board having good audio characteristics, thus improving the characteristics of the virtual speakers.

The present embodiment automatically changes the directivity of the directional speaker 3. Instead, it is also possible to provide manual directivity control, whereby when it is judged that the characteristic correction device 2 has a low correction effect, the characteristic correction control device 7*a* notifies a listener via the notification device 9 that desired audio characteristics cannot be obtained. In this case, the listener may change the directivity of the directional speaker 3 so as to realize virtual speakers in another area of the wall surface; alternatively, the listener may prepare another sound reflection board having good audio characteristics.

SIXTH EMBODIMENT

Figure 10:
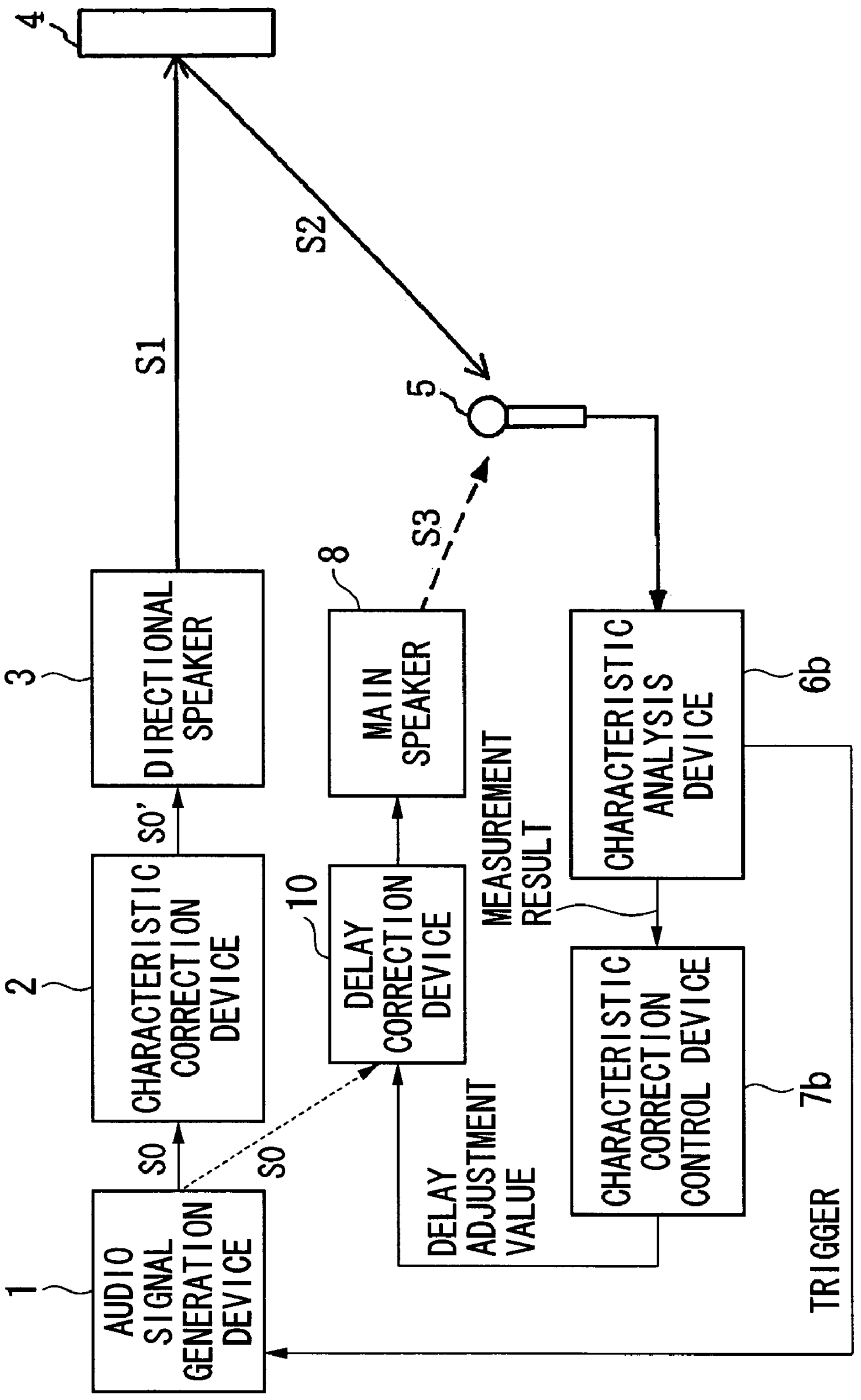
FIG. 10 is a block diagram showing the constitution of an audio characteristic correction system in accordance with a sixth embodiment of this invention.
Figure 11:
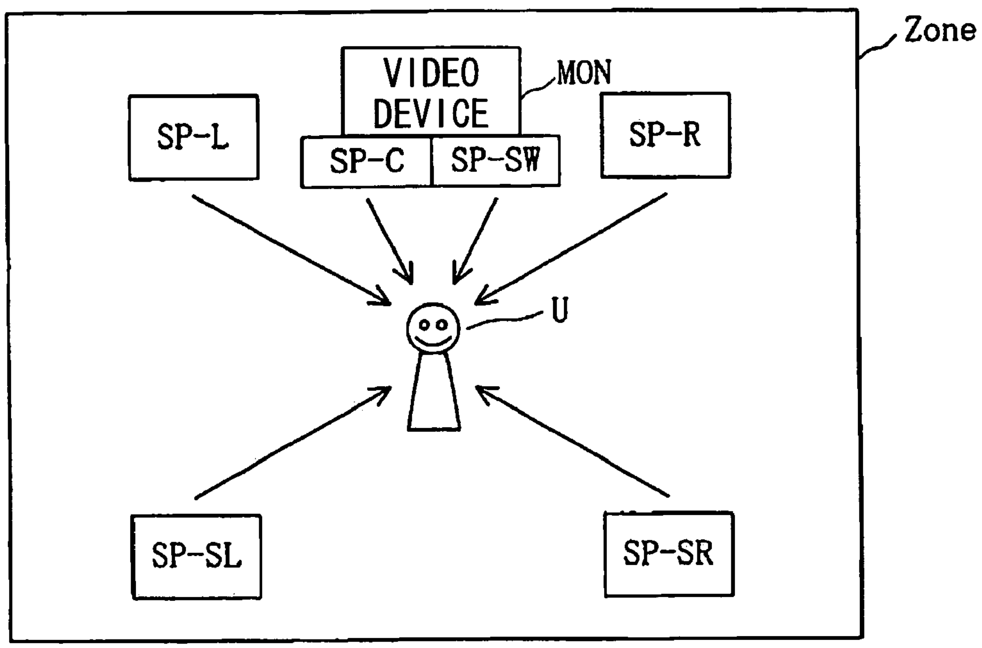
FIG. 11 is a plan view showing an example of arrangement of speakers in a digital surround system.
Figure 12:
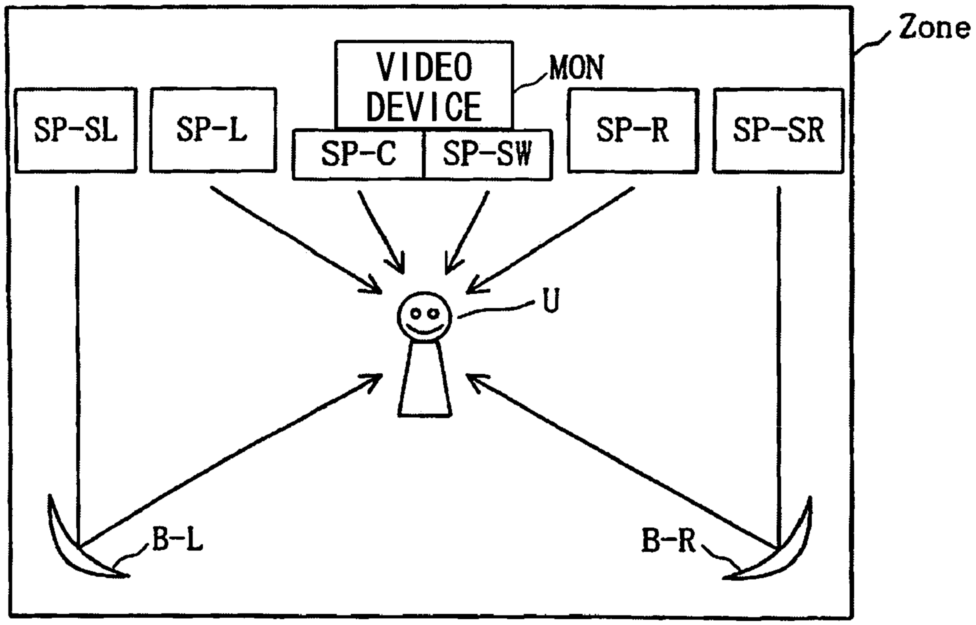
FIG. 12 is a plan view showing an example of arrangement of speakers in a surround system in which rear speakers are arranged in front of a listening position.
Figure 13:
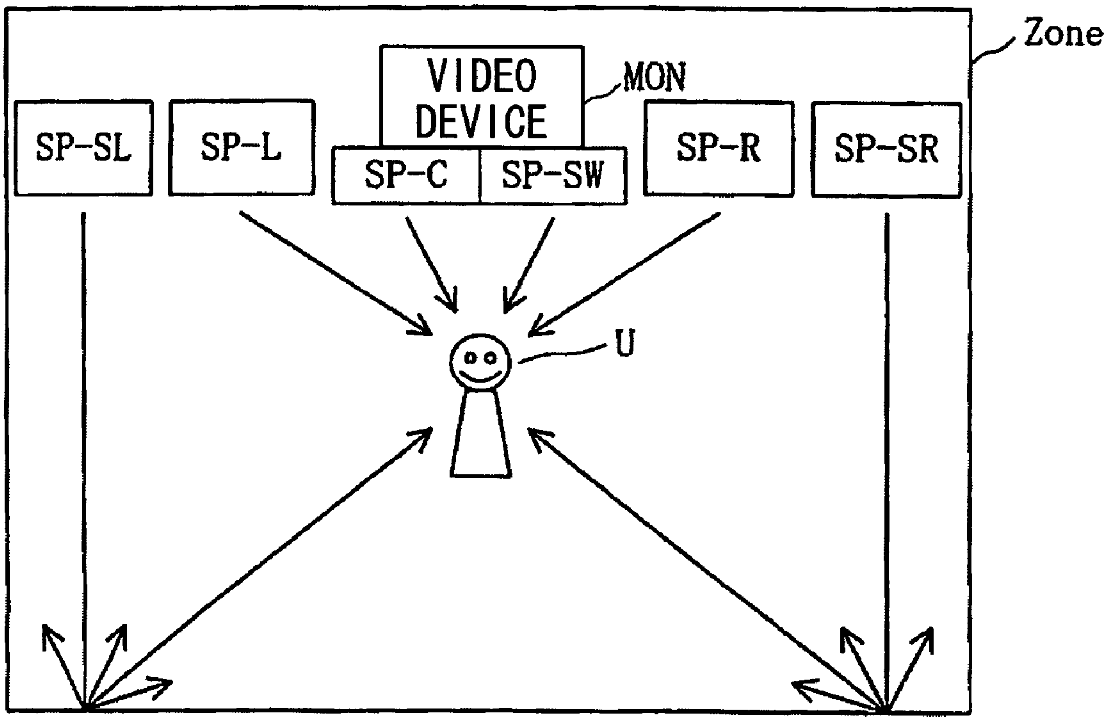
FIG. 13 is a plan view showing an example of arrangement of speakers in a surround system in which a wall surface positioned in the rear of a listening position is used as a sound reflection board.

Next, a sixth embodiment of this invention will be described. FIG. 10 is a block diagram showing the constitution of an audio characteristic correction system in accordance with the sixth embodiment, wherein parts identical to those of the third embodiment shown in FIG. 8 are designated by the same reference numerals. The audio characteristic correction system of the sixth embodiment includes an audio signal generation device 1, a characteristic correction device 2, a directional speaker 3, a microphone 5, a characteristic analysis device 6*b*, a characteristic correction control device 7*b*, a main speaker 8, and a delay correction device 10 for delaying an audio signal of a main channel. The characteristic analysis device 6*b* measures a time difference between an arrival time at which a sound S3 emitted from the main speaker 8 directly reaches the listening position and an arrival time at which a sound S2 emitted from the directional speaker 3 and reflected on the wall surface or the sound reflection board 4 reaches the listening position. The characteristic correction control device 7*b* sets a delay time for the delay correction device 10 based on the analysis results of the characteristic analysis device 6*b* so that the arrival times of the sounds S2 and S3 match each other.

Since the sound of the main speaker 8 directly reaching the listening position and the sound of the directional speaker 3 reaching the listening position via the wall surface or the sound reflection board 4 differ from each other in terms of propagation distance, they must differ from each other in arrival time at the listening position. In order to compensate for a time difference between arrival times at the listening position with respect to main-channel and surround-channel audio signals, the present embodiment controls a delay time applied to the main-channel audio signal.

As measurement methods of delay times, there are provided a method for measuring an absolute delay time and a method for measuring a relative delay time with respect to the sound S2 reflected on the wall surface or the sound reflection board 4. First, the method for measuring an absolute delay time will be described. The audio signal generation device 1 generates an audio signal S0 for measurement in response to a trigger signal output from the characteristic analysis device 6*b* and sends it to the characteristic correction device 2. The audio signal S0 for measurement is supplied to the directional speaker 3 via the characteristic correction device 2, so that a sound S1 is emitted towards and reflected on the wall surface or the sound reflection board 4 so as to produce a sound S2, which then reaches the microphone 5 at the listening position. After the characteristic analysis device 6*b* generates a trigger signal, it measures an arrival time at which the microphone 5 detects the sound S2.

The audio signal generation device 1 outputs the audio signal S0 for measurement to the delay correction device 10 in response to the trigger signal output from the characteristic analysis device 6*b*. At this time, the delay time of the delay correction device 10 is set to a minimum value. The audio signal S0 for measurement is supplied to the main speaker 8 via the delay correction device 10, so that a sound S3 is emitted towards the microphone 5. Thus, the characteristic analysis device 6*b* measures an arrival time at which the microphone 5 detects the sound S3 after generation of the trigger signal. Next, the characteristic analysis device 6*b* detects a time difference between the arrival times of the sounds S2 and S3 as an absolute delay time. Instead, the audio signal generation device 1 may supply an impulse signal simultaneously to the characteristic correction device 2 and the delay correction device 10; then, a time difference be detected between the arrival times of the sounds S2 and S3 reaching the microphone 5 based on the impulse signal, thus measuring an absolute delay time.

Next, the method for measuring a relative delay time will be described. The audio signal generation device 1 generates an audio signal S0 for measurement in response to a trigger signal output from the characteristic analysis device 6*b* and sends it simultaneously to the characteristic correction device 2 and the delay correction device 10. The characteristic analysis device 6*b* detects the correlation between plural sounds picked up by the microphone 5 so as to calculate a relative delay time. In this case, it is possible to use an impulse signal or random noise as the audio signal S0 for measurement.

Next, based on the absolute delay time or relative delay time measured by the characteristic analysis device 6*b*, the characteristic correction control device 7*b* sets a delay value for the delay correction device 10 so that the arrival time of the sound emitted from the main speaker 8 and reaching the listening position matches the arrival time of the sound emitted from and directional speaker 3, reflected on the wall surface or the sound reflection board 4, and then reaching the listening position. It is preferable that the delay correction device 10 be constituted using digital memory in order to secure fine adjustment of delay times with ease. After the setting of a delay time for the delay correction device 10, the audio signal generation device 1 supplies a main-channel audio signal to the delay correction device 10 and also supplies a surround-channel audio signal to the characteristic correction device 2.

As described above, the present embodiment includes the delay correction device 10 to delay a main-channel audio signal, whereby the arrival time of the sound emitted from the main speaker 8 and directly reaching the listening position can match the arrival time of the sound emitted from the directional speaker 3, reflected on the wall surface or the sound reflection board 4, and then reaching the listening position.

When an array speaker is used for the main speaker 8, the delay time of the array speaker can share the function of the delay correction device 10.

Incidentally, it is possible to realize at least a part of the characteristic analysis devices 6 and 6*b* and the characteristic correction control devices 7, 7*a*, and 7*b* used in the first to sixth embodiments by use of a microcomputer.

As described above, this invention is applicable to surround systems in which sounds emitted from directional speakers are reflected on wall surfaces or sound reflection boards so as to create virtual speakers.

Incidentally, this invention is not necessarily limited to the aforementioned embodiments; and various changes within the scope of the invention may be embraced by this invention.

The invention claimed is:

1. An audio characteristic correction system for an audio surround system including an array speaker that reflects sound off a wall surface or a sound reflection board to create virtual surround sound, for correcting for audio characteristics of the wall surface or the sound reflection board, the audio characteristic correction system comprising:

a sound pickup device for picking up sound from the array speaker that has been reflected off the wall surface or the sound reflection board;

a character correction device for correcting, based on the sound picked up by the sound pickup device, at least one of frequency-gain characteristics or frequency-phase characteristics, of an audio signal input to the array speaker such that the sound reflected off the wall surface or the sound reflection board has desired audio characteristics at a desired listening position; and a characteristic correction control device that changes the directivity of the array speaker while the sound pickup device is picking up sound so that the sound pickup device picks up sound reflected off of different areas of the wall surface or the sound reflection board, wherein the array sneaker includes a delay circuit and a plurality of directional speakers arranged in an array, wherein the characteristic correction control device sends a plurality of prescribed directivity control coefficients to the delay circuit, wherein the delay circuit changes delay times applied to the audio signal supplied to the directional sneakers based on the directivity control coefficients to emit a plurality number of sounds each having a different focal position so that the plurality number of sounds reflect off of different areas of the wall surface or the sound reflection board, wherein the characteristic correction control device receives and stores measurement results based on the sounds picked up by the sound pickup device regarding characteristics of the plurality number of sounds in relation to the directivity control coefficients, and wherein the characteristic correction control device selects one of the plurality of directivity control coefficients based on the stored measurement results to control the directivity of the speakers.

2. The audio characteristic correction system according to claim 1, wherein the array speaker further includes a plurality of gain adjustment circuits, each for one the speakers, and a plurality of amplifiers, each for one of the speakers, contained in a same housing.

3. An audio characteristic correction system for an audio surround system including an array speaker that reflects sound off a wall surface or a sound reflection board to create virtual surround sound, for correcting for audio characteristics of the wall surface or the sound reflection board, the audio characteristic correction system comprising:

measurement means for measuring audio characteristics of the sound reflected off the wall surface or the sound reflection board;

characteristic correction means for correcting, based on the audio characteristics measured by the measurement means, at least one of frequency-gain characteristics or frequency-phase characteristics, of an audio signal input to the array speaker such that the sound reflected off the wall surface or the sound reflection board has desired audio characteristics at a desired listening position; and characteristic correction control means for changing the directivity of the array speaker while the measurement means is measuring audio characteristics of the sound reflected of the wall surface or the sound reflection board so that the measurement means measures audio characteristics of different areas of the wall surface or the sound reflection board, wherein the array sneaker includes a delay circuit and a plurality of directional sneakers arranged in an array, wherein the characteristic correction control means sends a plurality of prescribed directivity control coefficients to the delay circuit, wherein the delay circuit changes delay times applied to the audio signal supplied to the directional sneakers based on the directivity control coefficients to emit a plurality number of sounds each having a different focal position so that the plurality number of sounds reflect off of different areas of the wall surface or the sound reflection board, wherein the characteristic correction control means receives and stores measurement results based on the audio characteristics measured by the measurement means regarding characteristics of the plurality number of sounds in relation to the directivity control coefficients, and wherein the characteristic correction control means selects one of the plurality of directivity control coefficients based on the stored measurement results to control the directivity of the sneakers.

4. The audio characteristic correction system according to claim 3, further comprising control means for setting at least one of the frequency-gain characteristics or frequency-phase characteristics, of the audio signal input to the array speaker for the characteristic correction means.

5. The audio characteristic correction system according to claim 3, wherein the array speaker further includes a plurality of gain adjustment circuits, each for one the speakers, and a plurality of amplifiers, each for one of the speakers, contained in a same housing.

* * * * *